United States Patent
Choi et al.

(10) Patent No.: US 12,122,892 B2
(45) Date of Patent: Oct. 22, 2024

(54) THERMOPLASTIC RESIN COMPOSITION AND METHOD OF MANUFACTURING MOLDED ARTICLE USING THE SAME

(71) Applicant: LG CHEM, LTD., Seoul (KR)

(72) Inventors: Gi Dae Choi, Daejeon (KR); Young Joo Kim, Daejeon (KR); Myong Jo Ham, Daejeon (KR); Oh Min Kwon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 687 days.

(21) Appl. No.: 17/293,432

(22) PCT Filed: Oct. 28, 2020

(86) PCT No.: PCT/KR2020/014842
§ 371 (c)(1),
(2) Date: May 12, 2021

(87) PCT Pub. No.: WO2021/086019
PCT Pub. Date: May 6, 2021

(65) Prior Publication Data
US 2021/0403682 A1 Dec. 30, 2021

(30) Foreign Application Priority Data

Oct. 31, 2019 (KR) .................. 10-2019-0138161
Oct. 26, 2020 (KR) .................. 10-2020-0139470

(51) Int. Cl.
| | | |
|---|---|---|
| *C08K 13/04* | (2006.01) | |
| *C08J 3/20* | (2006.01) | |
| *C08K 3/04* | (2006.01) | |
| *C08K 7/06* | (2006.01) | |
| *H05K 9/00* | (2006.01) | |
| *C08K 3/08* | (2006.01) | |

(52) U.S. Cl.
CPC ............... *C08K 13/04* (2013.01); *C08J 3/203* (2013.01); *H05K 9/009* (2013.01); *C08K 3/04* (2013.01); *C08K 3/041* (2017.05); *C08K 2003/0856* (2013.01); *C08K 7/06* (2013.01); *C08K 2201/003* (2013.01); *C08K 2201/006* (2013.01); *C08K 2201/011* (2013.01); *C08K 2201/013* (2013.01); *C08K 2201/014* (2013.01)

(58) Field of Classification Search
None
See application file for complete search history.

(56) References Cited

U.S. PATENT DOCUMENTS

| | | | |
|---|---|---|---|
| 4,690,778 A * | 9/1987 | Narumiya | ................ C08K 3/24 524/495 |
| 2013/0177765 A1 | 7/2013 | Lim et al. | |
| 2019/0062552 A1 | 2/2019 | Guo et al. | |
| 2019/0153179 A1 | 5/2019 | Grinsteinner | |
| 2021/0108047 A1* | 4/2021 | Matsumura | .............. C08K 7/06 |

FOREIGN PATENT DOCUMENTS

| | | |
|---|---|---|
| CN | 102985492 A | 3/2013 |
| CN | 103975023 A | 8/2014 |
| CN | 106433070 A | 9/2018 |
| CN | 109553962 A | 4/2019 |
| JP | 2004134515 A | 4/2004 |
| JP | 2006045330 A | 2/2006 |
| JP | 2006-152131 A | 6/2006 |
| JP | 2009-84561 A | 4/2009 |
| JP | 2009144000 A | 7/2009 |
| JP | 2012229345 A | 11/2012 |
| KR | 10-2006-0102416 A | 9/2006 |
| KR | 10-0790424 B1 | 12/2007 |
| KR | 10-2012-0023490 A | 3/2012 |
| KR | 10-2013-0075417 A | 7/2013 |
| KR | 10-2016-0083520 A | 7/2016 |
| KR | 10-2016-0147776 A | 12/2016 |
| KR | 10-1946793 B1 | 2/2019 |
| KR | 10-2019-0035031 A | 4/2019 |
| WO | 2012023672 A1 | 2/2012 |
| WO | 2012026652 A1 | 3/2012 |
| WO | WO-2018199008 A1 * | 11/2018 ................ C08J 5/04 |

OTHER PUBLICATIONS

Translation of KR 20120023490 (Year: 2012).*

* cited by examiner

*Primary Examiner* — Tanisha Diggs
(74) *Attorney, Agent, or Firm* — Bryan Cave Leighton Paisner LLP

(57) ABSTRACT

The present disclosure relates to a thermoplastic resin composition including a thermoplastic resin, carbon fiber, carbon nanotube, plate-shaped graphite, and metal fiber, which has excellent mechanical properties and electromagnetic wave shielding performance.

7 Claims, 1 Drawing Sheet

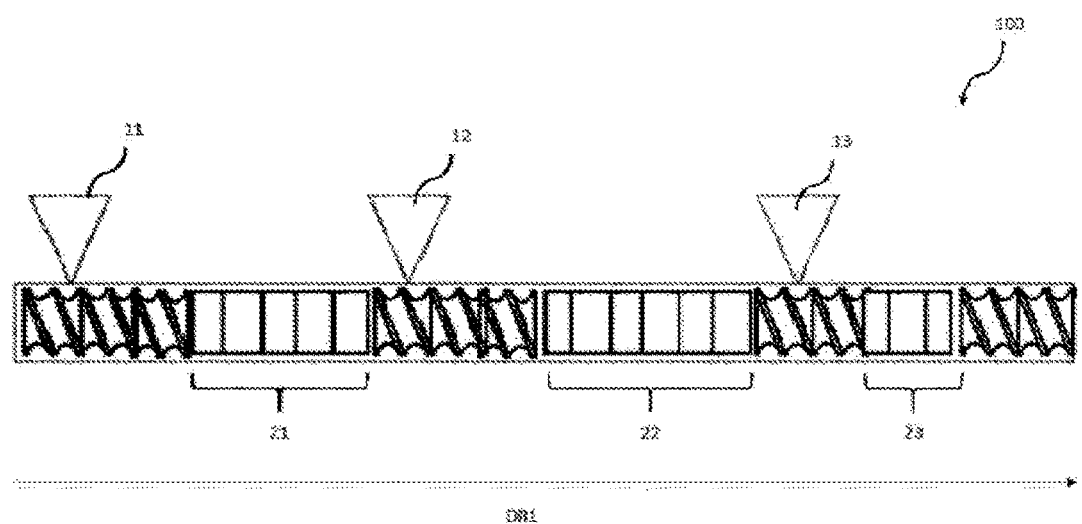

THERMOPLASTIC RESIN COMPOSITION AND METHOD OF MANUFACTURING MOLDED ARTICLE USING THE SAME

CROSS-REFERENCE TO RELATED APPLICATIONS

This application is a National Phase entry pursuant to U.S.C. § 371 of International Application No. PCT/KR2020/0014842, filed on Oct. 28, 2020, and claims priority to and the benefit of Korean Patent Application No. 10-2019-0138161, filed on Oct. 31, 2019, and Korean Patent Application No. 10-2020-0139470, filed on Oct. 26, 2020, with the Korean Intellectual Property Office, the disclosures of which are hereby incorporated by reference in their entirety for all purposes as if fully set forth herein.

The present invention relates to a thermoplastic resin composition and a method of manufacturing a molded article using the same.

TECHNICAL FIELD

Background Art

With development of electric/electronic technology, there is a trend toward digitalization in various industrial fields. Also, in automobile and electrical/electronic fields, system digitalization is in progress to improve performance, stability, and convenience to meet the needs of users.

In recent years, it has been reported that electromagnetic waves generated from electronic devices adversely affect other devices or human bodies. Accordingly, research is being actively conducted to develop a material for shielding electromagnetic waves.

Metallic materials such as conductive materials are heavy and expensive. In consideration of these disadvantages, polymer resins, which are advantageous in terms of weight reduction, price, design, and the like, have mainly been used to manufacture electronic devices and automobile components.

However, since most polymer resins have a property of transmitting electromagnetic waves, it is difficult to effectively shield electromagnetic waves using a polymer.

Accordingly, a material for shielding electromagnetic waves needs to be developed, and in particular, there is increasing demand for a material capable of shielding electromagnetic waves while satisfying mechanical properties.

DISCLOSURE

Technical Problem

Therefore, the present invention has been made in view of the above problems, and it is one object of the present invention to provide a thermoplastic resin composition having excellent mechanical properties and electromagnetic wave shielding performance, and a method of manufacturing a molded article using the thermoplastic resin composition.

The technical problems that are intended to be achieved in the present invention are not restricted to the above described problems, and other problems, which are not mentioned herein, could be clearly understood by those of ordinary skill in the art from details described below.

Technical Solution

In accordance with one aspect of the present invention, provided is a thermoplastic resin composition including a thermoplastic resin, carbon fiber, carbon nanotube, plate-shaped graphite, and metal fiber.

In accordance with another aspect of the present invention, provided is a method of manufacturing a molded article, the method including forming a first kneaded product by kneading a thermoplastic resin, carbon nanotube, and plate-shaped graphite; forming a second kneaded product by adding carbon fiber to the first kneaded product and kneading; forming a thermoplastic resin composition by adding metal fiber to the second kneaded product and kneading; and manufacturing a molded article by molding the thermoplastic resin composition.

In accordance with yet another aspect of the present invention, provided is a molded article comprising the thermoplastic resin composition.

Advantageous Effects

A thermoplastic resin composition according to one embodiment of the present invention can have excellent mechanical properties and electromagnetic wave shielding performance.

In addition, when a method of manufacturing a molded article according to one embodiment of the present invention is used, a molded article having excellent mechanical properties and electromagnetic wave shielding performance can be easily manufactured.

The effects of the present invention are not limited to the above-described effects, and effects not mentioned herein will be clearly understood by those skilled in the art from the present specification and the accompanying drawings.

DESCRIPTION OF DRAWINGS

FIG. 1 is a cross-sectional view of an extruder used to manufacture a molded article according to one embodiment of the present invention.

BEST MODE

In the present invention, it is to be understood that, unless stated otherwise, when a part "comprises" any element, the part may include other elements without excluding other elements.

In the present invention, when a member is located "on" the other member, this includes not only the case where the member is in contact with the other member but also the case where another member is present between the two members.

In the present specification, "parts by weight" may mean a weight ratio between components.

Hereinafter, a thermoplastic resin composition and a method of manufacturing a molded article using the same according to the present invention will be described in detail.

According to one embodiment of the present invention, a thermoplastic resin composition including a thermoplastic resin; and a filler including carbon fiber, carbon nanotubes, plate-shaped graphite, and metal fiber is provided.

The thermoplastic resin composition according to one embodiment of the present invention can have excellent mechanical properties and electromagnetic wave shielding performance.

According to one embodiment of the present invention, the thermoplastic resin can include at least one of a nylon resin, a polycarbonate resin, a polyalkylene terephthalate resin including a polybutylene terephthalate resin and a polyethylene terephthalate resin, and a maleic anhydride-modified polyolefin resin. In this case, when a thermoplastic resin composition including the above thermoplastic resin is used, a molded article having excellent mechanical properties can be easily implemented.

According to one embodiment of the present invention, the maleic anhydride-modified polyolefin resin can be a polymer prepared by grafting maleic anhydride onto a polyolefin resin at a grafting degree of 0.5% by weight to % by weight. When a thermoplastic resin composition including a polyolefin resin onto which maleic anhydride is grafted at a grafting degree of 0.5% by weight to 2% by weight is used, a molded article having excellent mechanical properties such as tensile strength and impact strength can be provided.

In the present specification, grafting degree can be measured based on results obtained through acid-base titration of a modified polyolefin resin. As a specific example, 1 g of a modified polyolefin resin is added to 150 ml of xylene saturated with water and refluxed for about 2 hours. Then, 1% by weight of a thymol blue-dimethylformamide solution was added thereto in a small amount, and slight excess titration is performed using a 0.05 N sodium hydroxide-ethyl alcohol solution to obtain an ultramarine solution. An acid value is determined by performing back titration of this solution with a 0.05 N hydrochloric acid-isopropyl alcohol solution until the solution becomes yellowish. Thereby, the content (% by weight) of a compound, i.e., maleic anhydride, grafted onto a polyolefin resin can be calculated. In this case, the content of maleic anhydride included in a modified polyolefin resin corresponds to grafting degree.

The maleic anhydride-grafted polyolefin can be a polymer of monomer including an olefin having 1 to 5 carbon atoms. Specifically, in the present invention, polyethylene onto which maleic anhydride is grafted at a grafting degree of 0.5% by weight to 2% by weight can be used.

According to one embodiment of the present invention, the carbon fiber can have a diameter of 5 μm to 15 μm. Specifically, the carbon fiber can have a diameter of 7 μm to 13 μm, 8.5 μm to 12.5 μm, 5 μm to 7.5 μm, 9 μm to 12.5 μm, or 12 μm to 15 μm. When a thermoplastic resin composition including carbon fiber having a diameter within this range is used, processability and moldability can be excellent and strength can be improved. In addition, when a thermoplastic resin composition includes the carbon fiber having a diameter within the above range, the electromagnetic wave shielding performance of the thermoplastic resin composition can be improved.

In the present specification, the diameter of carbon fiber can be measured using a scanning electron microscope (SEM). Specifically, 20 fiber strands are selected using a scanning electron microscope, and the diameter of each strand is measured using an icon bar for measuring diameter, and then an average diameter of the carbon fiber is calculated in arithmetic mean using the measured values.

According to one embodiment of the present invention, based on 100 parts by weight of the thermoplastic resin, the carbon fiber can be contained in an amount of 5 parts by weight to 60 parts by weight. Specifically, based on 100 parts by weight of the thermoplastic resin, the carbon fiber can be contained in an amount of 10 parts by weight to 50 parts by weight, 15 parts by weight to 45 parts by weight, 17.5 parts by weight to 40 parts by weight, or 20 parts by weight to 35 parts by weight. More specifically, based on 100 parts by weight of the thermoplastic resin, the carbon fiber can be contained in an amount of 5 parts by weight to 20 parts by weight, 7.5 parts by weight to 25 parts by weight, 10 parts by weight to 35 parts by weight, 20 parts by weight to 40 parts by weight, 25 parts by weight to 45 parts by weight, or 30 parts by weight to 60 parts by weight.

By adjusting the relative contents of the thermoplastic resin and the carbon fiber within the above-described range, the strength of the thermoplastic resin composition can be improved, and the appearance of a molded article manufactured using the thermoplastic resin composition can be excellent. In addition, when the carbon fiber is contained in an amount within the above-described range, the rigidity of a thermoplastic resin composition can be excellent, and a molded article having improved electromagnetic wave shielding efficiency can be easily implemented.

According to one embodiment of the present invention, the carbon nanotubes can have a BET surface area of 200 $m^2/g$ to 300 $m^2/g$. Specifically, the carbon nanotubes can have a BET surface area of 220 $m^2/g$ to 280 $m^2/g$, 250 $m^2/g$ to 270 $m^2/g$, 210 $m^2/g$ to 240 $m^2/g$, 245 $m^2/g$ to 265 $m^2/g$, or 275 $m^2/g$ to 300 $m^2/g$. A thermoplastic resin composition including the carbon nanotubes having a BET surface area within this range can have improved conductivity and electromagnetic wave shielding efficiency.

In the present specification, a BET surface area can be measured using BET analysis equipment (surface area and porosity analyzer ASAP 2020, Micromeritics Co.) according to a nitrogen gas adsorption method.

According to one embodiment of the present invention, based on 100 parts by weight of the thermoplastic resin, the carbon nanotubes can be contained in an amount of 1 part by weight to 5 parts by weight. Specifically, based on 100 parts by weight of the thermoplastic resin, the carbon nanotubes can be contained in an amount of 1 part by weight to 3 parts by weight, 1 part by weight to 2 parts by weight, 1 part by weight to 2.5 parts by weight, or 3 parts by weight to 5 parts by weight.

By adjusting the relative contents of the thermoplastic resin and the carbon nanotubes within the above-described range, the conductivity and electromagnetic wave shielding efficiency of a thermoplastic resin composition can be effectively improved. In addition, when the carbon nanotubes are contained in an amount within the above-described range, deterioration in the mechanical properties of a thermoplastic resin composition can be prevented.

According to one embodiment of the present invention, the thermoplastic resin composition can include plate-shaped graphite. By using plate-shaped graphite, the electromagnetic wave shielding efficiency of the thermoplastic resin composition can be further improved.

Plate-shaped graphite commonly used in the art to which the present invention pertains can be used in the present invention without particular limitation. Such plate-shaped graphite can have a high aspect ratio, and can be naturally plate-shaped or chemically or physically separated from a layered structure to have a plate shape. As a specific example, plate-shaped graphite having an aspect ratio of 2 or more, 5 or more, 7 or more, 2 to 200, 5 to 200, or 7 to 200 can be used, without being limited thereto.

In the present specification, aspect ratio measurement methods commonly used in the art to which the present invention pertains can be used without particular limitation.

According to one embodiment of the present invention, based on 100 parts by weight of the thermoplastic resin, the plate-shaped graphite can be contained in an amount of 1 part by weight to 10 parts by weight. Specifically, based on 100 parts by weight of the thermoplastic resin, the plate-shaped graphite can be contained in an amount of 1.5 parts by weight to 8 parts by weight, 3 parts by weight to 5 parts by weight, 1 part by weight to 5 parts by weight, 2.5 parts by weight to 5.5 parts by weight, or 6 parts by weight to 10 parts by weight.

By adjusting the content of the plate-shaped graphite included in the thermoplastic resin composition within the above-described range, the electromagnetic wave shielding efficiency of the thermoplastic resin composition can be further improved. In addition, by adjusting the relative contents of the thermoplastic resin and the plate-shaped graphite within the above-described range, deterioration in the mechanical properties of the thermoplastic resin composition can be prevented, and a molded article having excellent appearance can be implemented.

According to one embodiment of the present invention, the metal fiber can have a diameter of 5 μm to 20 μm. Specifically, the metal fiber can have a diameter of 7 μm to 18 μm, 9 μm to 15 μm, 5 μm to 10 μm, 7.5 μm to 14.5 μm, or 16 μm to 20 μm. When the metal fiber has a diameter within this range, the electromagnetic wave shielding performance of a thermoplastic resin composition can be further improved.

In the present specification, the diameter of metal fiber can be measured using a scanning electron microscope (SEM). Specifically, 20 fiber strands are selected using a scanning electron microscope, and the diameter of each strand is measured using an icon bar for measuring diameter, and then an average diameter of the metal fiber is calculated in arithmetic mean using the measured values.

According to one embodiment of the present invention, based on 100 parts by weight of the thermoplastic resin, the metal fiber can be contained in an amount of 1 part by weight to 20 parts by weight. Specifically, based on 100 parts by weight of the thermoplastic resin, the metal fiber can be contained in an amount of 3 parts by weight to 18 parts by weight, 5 parts by weight to 15 parts by weight, 7 parts by weight to 10 parts by weight, 1 part by weight to 7 parts by weight, 3.5 parts by weight to 17.5 parts by weight, or 12 parts by weight to 20 parts by weight.

By adjusting the content of the metal fiber within the above-described range, the rigidity and electromagnetic wave shielding performance of a thermoplastic resin composition can be further improved.

In addition, when the relative contents of the thermoplastic resin and the metal fiber are adjusted within the above-described range, when a thermoplastic resin composition including the thermoplastic resin and the metal fiber is used, a molded article having excellent appearance can be manufactured.

The thermoplastic resin composition of the present invention preferably has a tensile strength of 150 MPa or more, more preferably 160 MPa or more, still more preferably 165 MPa or more as measured according to ASTM D638. As a specific example, the thermoplastic resin composition preferably has a tensile strength of 150 to 200 MPa, more preferably 160 to 190 MPa, still more preferably 165 to 190 MPa. Within this range, tensile strength and physical property balance can be excellent.

The thermoplastic resin composition of the present invention preferably has an impact strength of 60 J/m or more, more preferably 65 J/m or more, still more preferably J/m or more as measured according to ISO 180A. As a specific example, the thermoplastic resin composition preferably has an impact strength of 60 to 130 J/m, more preferably 65 to 120 J/m, still more preferably 70 to 120 J/m. Within this range, impact strength and physical property balance can be excellent.

The thermoplastic resin composition of the present invention preferably has a flexural modulus of 18,000 MPa or more, more preferably 19,000 MPa or more, still more preferably 21,000 MPa as measured according to ASTM D790. As a specific example, the thermoplastic resin composition preferably has a flexural modulus of 18,000 to 26,000 MPa, more preferably 19,000 to 25,000 MPa, still more preferably 21,000 to 25,000 MPa. Within this range, flexural modulus and physical property balance can be excellent.

The thermoplastic resin composition of the present invention preferably has an electromagnetic wave shielding ability of 65 dB or more, more preferably 70 dB or more, still more preferably 73 dB or more as measured under a condition of 10 MHz using EM2107A manufactured by Electro-Metrics Corporation. As a specific example, the thermoplastic resin composition preferably has an electromagnetic wave shielding ability of 65 to 90 dB, more preferably 70 to 85 dB, still more preferably 73 to 85 dB. Within this range, electromagnetic wave shielding performance and mechanical property balance can be excellent.

The thermoplastic resin composition of the present invention preferably has an electromagnetic wave shielding ability of 65 dB or more, more preferably 70 dB or more, still more preferably 73 dB or more as measured under a condition of 1 GHz using EM2107A manufactured by Electro-Metrics Corporation. As a specific example, the thermoplastic resin composition preferably has an electromagnetic wave shielding ability of 65 to 90 dB, more preferably 70 to 85 dB, still more preferably 73 to 85 dB. Within this range, electromagnetic wave shielding performance and mechanical property balance can be excellent.

The thermoplastic resin composition of the present invention is preferably used in automobile components or electrical and electronic components, more preferably automobile components or electrical and electronic components requiring an electromagnetic wave shielding performance of 50 dB or more in MHz and GHz frequency regions, still more preferably substitutes for automobile metal components or electrical and electronic metal components, still more preferably electric automobile components or hybrid electric automobile components. In this case, the automobile components or the electrical and electronic components can be defined as products including the thermoplastic resin composition of the present invention or products manufactured using the thermoplastic resin composition of the present invention.

In one embodiment of the present invention, a method of manufacturing a molded article including a step of forming a first kneaded product by kneading a thermoplastic resin, carbon nanotubes, and plate-shaped graphite; a step of forming a second kneaded product by adding carbon fiber to the first kneaded product and performing kneading; a step of forming a thermoplastic resin composition by adding metal fiber to the second kneaded product and performing kneading; and a step of forming a molded article by molding the thermoplastic resin composition can be provided.

When the method of manufacturing a molded article according to one embodiment of the present invention is used, a molded article having excellent mechanical properties and electromagnetic wave shielding performance can be easily manufactured.

The method of manufacturing a molded article according to one embodiment of the present invention can be a method of manufacturing a molded article using the thermoplastic resin composition according to one embodiment described above.

Specifically, a thermoplastic resin, carbon fiber, carbon nanotubes, plate-shaped graphite, and metal fiber used in the method of manufacturing a molded article according to one embodiment of the present invention can be the same as those included in the above-described thermoplastic resin composition.

According to the method of manufacturing a molded article according to one embodiment of the present invention, by controlling the order in which a thermoplastic resin, carbon fiber, carbon nanotubes, plate-shaped graphite, and metal fiber are kneaded, a molded article having excellent mechanical properties and electromagnetic wave shielding performance can be more efficiently manufactured.

FIG. 1 is a cross-sectional view of an extruder used to manufacture a molded article according to one embodiment of the present invention. Referring to FIG. 1, an extruder 100 may include first, second, and third inlets 11, 12, and 13 and first, second, and third kneading blocks 21, 22, and 23. With this configuration, a material put in a first direction DR1 can be kneaded and discharged. Specifically, materials put into the first inlet 11 can be kneaded in the process of being moved to the first kneading block 21 to form a first kneaded product in the first kneading block 21. Materials put into the second inlet 12 can be mixed with the first kneaded product, and can be kneaded in the process of being moved to the second kneading block 22 to form a second kneaded product in the second kneading block 22. In addition, materials put into the third inlet 13 can be mixed with the second kneaded product, and can be kneaded in the process of being moved to the third kneading block 23 to form a final product in the third kneading block 23.

According to one embodiment of the present invention, by kneading a thermoplastic resin, carbon nanotubes, and plate-shaped graphite, a first kneaded product can be formed. Referring to FIG. 1, by putting the thermoplastic resin, the carbon nanotubes, and the plate-shaped graphite into the first inlet 11 and performing kneading, the first kneaded product can be formed in the first kneading block 21.

According to one embodiment of the present invention, based on 100 parts by weight of the thermoplastic resin, the carbon nanotubes can be fed in an amount of 1 part by weight to 5 parts by weight. Specifically, based on 100 parts by weight of the thermoplastic resin, the carbon nanotubes can be fed in an amount of 1 part by weight to 3 parts by weight, 1 part by weight to 2 parts by weight, 1 part by weight to 2.5 parts by weight, or 3 parts by weight to 5 parts by weight.

By adjusting the relative input amounts of the thermoplastic resin and the carbon nanotubes within the above-described range, the conductivity and electromagnetic wave shielding efficiency of a molded article to be manufactured can be effectively improved. In addition, when the carbon nanotubes are fed within the above-described range, deterioration in the mechanical properties of the molded article can be prevented.

According to one embodiment of the present invention, based on 100 parts by weight of the thermoplastic resin, the plate-shaped graphite can be fed in an amount of 1 part by weight to 10 parts by weight. Specifically, based on 100 parts by weight of the thermoplastic resin, the plate-shaped graphite can be fed in an amount of 1.5 parts by weight to 8 parts by weight, 3 parts by weight to 5 parts by weight, 1 part by weight to 5 parts by weight, 2.5 parts by weight to 5.5 parts by weight, or 6 parts by weight to 10 parts by weight.

By adjusting the input amount of the plate-shaped graphite within the above-described range, the electromagnetic wave shielding efficiency of a molded article can be further improved. In addition, when the relative input amounts of the thermoplastic resin and the plate-shaped graphite are within the above-described ranges, deterioration in the mechanical properties of a molded article can be prevented, and a molded article having excellent appearance can be implemented.

According to one embodiment of the present invention, by adding the carbon fiber to the first kneaded product and performing kneading, a second kneaded product can be formed. Referring to FIG. 1, by putting the carbon fiber into the second inlet 12 and kneading the carbon fiber and the first kneaded product, the second kneaded product can be formed in the second kneading block 22.

According to one embodiment of the present invention, based on 100 parts by weight of the thermoplastic resin, the carbon fiber can be fed in an amount of 5 parts by weight to 60 parts by weight. Specifically, based on 100 parts by weight of the thermoplastic resin, the carbon fiber can be fed in an amount of 10 parts by weight to 50 parts by weight, 15 parts by weight to 45 parts by weight, 17.5 parts by weight to 40 parts by weight, or 20 parts by weight to 35 parts by weight.

By adjusting the relative input amounts of the thermoplastic resin and the carbon fiber within the above-described range, a molded article having improved strength and excellent appearance can be manufactured. In addition, when the carbon fiber is fed in an amount within the above-described range, a molded article having excellent rigidity and improved electromagnetic wave shielding efficiency can be easily implemented.

According to one embodiment of the present invention, by adding the metal fiber to the second kneaded product and performing kneading, a thermoplastic resin composition can be formed. Referring to FIG. 1, by putting the metal fiber into the third inlet 13 and kneading the metal fiber and the second kneaded product, the thermoplastic resin composition can be formed in the third kneading block 23.

According to one embodiment of the present invention, based on 100 parts by weight of the thermoplastic resin, the metal fiber can be fed in an amount of 1 part by weight to 20 parts by weight. Specifically, based on 100 parts by weight of the thermoplastic resin, the metal fiber can be fed in an amount of 3 parts by weight to 18 parts by weight, 5 parts by weight to 15 parts by weight, 7 parts by weight to 10 parts by weight, 1 part by weight to 7 parts by weight, 3.5 parts by weight to 17.5 parts by weight, or 12 parts by weight to 20 parts by weight.

By adjusting the input amount of the metal fiber within the above-described range, the rigidity and electromagnetic wave shielding performance of a molded article can be further improved. In addition, when the relative input amounts of the thermoplastic resin and the metal fiber are within the above-described range, a molded article having excellent appearance can be provided.

According to one embodiment of the present invention, in the step of molding a thermoplastic resin composition, the thermoplastic resin composition can be extrusion-molded or injection-molded to manufacture a molded article. That is, the molded article can be formed by injection-molding or extrusion-molding the thermoplastic resin composition. Any extrusion molding method or injection molding method commonly used in the art to which the present invention pertains can be used without particular limitation.

For example, the molded article can be formed by kneading and extruding the thermoplastic resin composition. Kneading and extrusion can be performed using a conventional extruder. As a preferred example, a single-screw extruder, a twin-screw extruder, or the like can be used.

The molded article of the present invention can include the thermoplastic resin composition.

The molded article preferably includes automobile components or electrical and electronic components, more preferably automobile components or electrical and electronic components requiring an electromagnetic wave shielding performance of 50 dB or more in MHz and GHz frequency range, still more preferably substitutes for automobile metal components or electrical and electronic metal components, still more preferably electric automobile components or hybrid electric automobile components.

Hereinafter, the present invention will be described in detail by describing exemplary embodiments of the invention. However, the invention can be embodied in many different forms and should not be construed as being limited to the embodiments set forth herein. These embodiments are provided to more fully describe the present invention to those skilled in the art.

Hereinafter, the present invention will be described in detail with reference to examples.

[Preparation of Molded Article]

Materials used in Examples and Comparative Examples below are as follows.

A) Thermoplastic resin:

a1) Polycarbonate resin: 1330 product of LG Chemical Co. was used.

a2) Nylon 66 resin: 3602 product of Invista Co. was used.

a3) Polybutylene terephthalate resin: GP2000 product of LG Chemical Co. was used.

a4) Modified polyolefin resin: Polyethylene onto which maleic anhydride is grafted at a grafting degree of about 1.5% by weight was used.

a5) Nylon 6 resin: 2451 product of TK Chemical Co. was used.

a6) Polyethylene terephthalate (PET) resin: BB8055 product of SK Chemical Co. was used.

B) Carbon fiber:

Pyrofil product of Zoltek Co. was used.

C) Carbon nanotube:

c1) CP1002M product of LG Chemical Co. having a BET surface area of about 250 $m^2/g$ was used.

c2) A large-diameter product having a BET surface area of about 150 $m^2/g$ was used.

C3) A small-diameter product having a BET surface area of about 400 $m^2/g$ was used.

D) Plate-shaped graphite:

CB-100 of Japan Graphite Co., a DML plate-shaped graphite product, was used.

E) Metal fiber:

Stainless steel fiber of BEKAERT Co. having an average diameter of 9 μm was used.

Example 1

To prepare a thermoplastic resin composition and manufacture a molded article, an extruder was manufactured as shown in FIG. 1. The temperature of the extruder was set to about 250° C. to 320° C., and the rate of rotation was set to 300 revolutions/minute.

In the extruder 100, a nylon 66 resin as a thermoplastic resin, carbon nanotubes, and plate-shaped graphite were fed into the first inlet 11 and kneaded to form a first kneaded product. In this case, based on 100 parts by weight of the thermoplastic resin, the carbon nanotubes were fed in an amount of 1 part by weight, and the plate-shaped graphite was fed in an amount of 3 parts by weight.

Thereafter, carbon fiber was fed into the second inlet 12 and kneaded to form a second kneaded product. In this case, based on 100 parts by weight of the thermoplastic resin, the carbon fiber was fed in an amount of 35 parts by weight.

Thereafter, metal fiber was fed into the third inlet 13 and kneaded to form a thermoplastic resin composition.

In this case, based on 100 parts by weight of the thermoplastic resin, the metal fiber was fed in an amount of 5 parts by weight.

Thereafter, the thermoplastic resin composition was molded into pellets through the extruder to manufacture a molded article.

Examples 2 to 11

Thermoplastic resin compositions were prepared and molded articles were manufactured in the same manner as in Example 1, except that components and contents of the compositions fed into the extruder were adjusted according to Table 1 below.

TABLE 1

| Classification | | 1 | 2 | 3 | 4 | 5 | 6 | 7 | 8 | 9 | 10 | 11 |
|---|---|---|---|---|---|---|---|---|---|---|---|---|
| A | a1 | 100 | 100 | 90 | | | 100 | 100 | | | 100 | 100 |
|   | a2 | | | | 100 | | | | | | | |
|   | a3 | | | | | 100 | | | | | | |
|   | a4 | | | 10 | | | | | | | | |
|   | a5 | | | | | | | | 100 | | | |
|   | a6 | | | | | | | | | 100 | | |
| B |    | 35 | 30 | 30 | 20 | 30 | 50 | 65 | 20 | 30 | 35 | 35 |
| C | c1 | 1 | 2 | 2 | 1 | 1 | 1 | 1 | 1 | 1 | | |
|   | c2 | | | | | | | | | | 1 | |
|   | c3 | | | | | | | | | | | 1 |
| D |    | 3 | 3 | 3 | 5 | 5 | 3 | 3 | 5 | 5 | 3 | 3 |
| E |    | 5 | 10 | 5 | 10 | 15 | 5 | 5 | 10 | 15 | 5 | 5 |

Comparative Examples 1 to 4

Thermoplastic resin compositions were prepared and molded articles were manufactured in the same manner as in Example 1, except that components and contents of the compositions fed into the extruder were adjusted according to Table 2 below.

TABLE 2

| Classification | | Comparative Example 1 | Comparative Example 2 | Comparative Example 3 | Comparative Example 4 |
|---|---|---|---|---|---|
| A | a1 | 100 | 100 | | |
|   | a2 | | | 100 | |
|   | a3 | | | | 100 |
|   | a4 | | | | |
| B |    | 30 | 30 | 20 | 30 |
| C |    | 1 | 1 | 7 | — |
| D |    | — | 5 | — | 2 |
| E |    | 5 | — | — | 5 |

[Measurement of Physical Properties of Molded Article]

The molded articles manufactured in Examples 1 to 11 and Comparative Examples 1 to 4 were molded into specimens for measuring physical properties using an injection machine (80 tons, Engel Co.).

The physical properties of the specimens were measured according to the following methods, and the results are shown in Tables 3 and 4.

Tensile strength: Tensile strength was measured using a specimen having a thickness of 3.2 mm at a measurement rate of 5 mm/min according to ASTM D638.

Impact strength: Notched Izod impact strength was measured using a specimen having a thickness of 4 mm according to ISO 180A. Specifically, impact strength was measured at room temperature (23° C.) after the specimen was notched.

Flexural modulus: Flexural modulus was measured using a specimen having a thickness of 3.2 mm at a measurement rate of 1.3 mm/min according to ASTM D790.

Electromagnetic wave shielding ability: Electromagnetic wave shielding ability was measured at 10 MHz and 1 GHz using EM2107A manufactured by Electro-Metrics Corporation.

Appearance: The appearance of an injection-molded specimen was visually evaluated. When moldability and appearance were excellent, it was marked with "⊚". When moldability and appearance were good, it was marked with "○". When appearance was excellent, it was marked with "Δ". When appearance was deteriorated, it was marked with "X". When appearance was very poor, it was marked with "XX".

TABLE 3

| Evaluation | | 1 | 2 | 3 | 4 | 5 | 6 | 7 | 8 | 9 | 10 | 11 |
|---|---|---|---|---|---|---|---|---|---|---|---|---|
| Tensile strength (MPa) | | 185 | 175 | 165 | 155 | 162 | 190 | 191 | 150 | 162 | 181 | 183 |
| Impact strength (J/m) | | 91 | 72 | 115 | 69 | 87 | 93 | 90 | 70 | 87 | 92 | 90 |
| Flexural modulus (MPa) | | 24,500 | 23,000 | 21,000 | 19,000 | 22,500 | 28,000 | 29,500 | 19,000 | 22,000 | 24,200 | 24,300 |
| Electromagnetic | 10 MHz | 75 | 79 | 73 | 74 | 82 | 80 | 74 | 77 | 75 | 74 | 77 |
| wave shielding (dB) | 1 GHz | 80 | 78 | 75 | 73 | 76 | 84 | 73 | 81 | 80 | 79 | 83 |
| Appearance | | ○ | ⊚ | ○ | ○ | ○ | ○ | ○ | ○ | ○ | ○ | ○ |

TABLE 4

| Evaluation | Comparative Example 1 | Comparative Example 2 | Comparative Example 3 | Comparative Example 4 |
|---|---|---|---|---|
| Tensile strength (MPa) | 175 | 168 | 134 | 155 |
| Impact strength (J/m) | 70 | 73 | 60 | 72 |
| Flexural modulus (MPa) | 20,000 | 21,500 | 15,000 | 19,500 |

TABLE 4-continued

| Evaluation | | Comparative Example 1 | Comparative Example 2 | Comparative Example 3 | Comparative Example 4 |
|---|---|---|---|---|---|
| Electromagnetic wave shielding (dB) | 10 MHz | 54 | 45 | 40 | 49 |
|  | 1 GHz | 48 | 43 | 39 | 41 |
| Appearance | | X | Δ | XX | ○ |

Referring to Tables 1 to 4, it can be confirmed that, compared to Comparative Examples 1 to 4, the molded articles according to Examples 1 to 11 of the present invention have excellent mechanical properties and electromagnetic wave shielding performance. In particular, it can be seen that the molded articles according to Examples 1 to 11 of the present invention exhibit an electromagnetic wave shielding ability of 70 dB or more at 10 MHz and an electromagnetic wave shielding ability of 70 dB or more at 1 GHz.

Therefore, since the thermoplastic resin composition according to one embodiment of the present invention has excellent mechanical properties and electromagnetic wave shielding performance, the thermoplastic resin composition can be applied to automobile components and electrical and electronic components requiring electromagnetic wave shielding performance.

DESCRIPTION OF SYMBOLS

100: EXTRUDER
11: FIRST INLET
12: SECOND INLET
13: THIRD INLET
21: FIRST KNEADING BLOCK
22: SECOND KNEADING BLOCK
23: THIRD KNEADING BLOCK
DR1: FIRST DIRECTION

The invention claimed is:

1. A thermoplastic resin composition, comprising:
a thermoplastic resin,
carbon fiber,
carbon nanotube,
plate-shaped graphite, and
metal fiber,
   wherein, based on 100 parts by weight of the thermoplastic resin, the carbon fiber is contained in an amount of 5 parts by weight to 60 parts by weight, the carbon nanotube is contained in an amount of 1 part by weight to 5 parts by weight, the plate-shaped graphite is contained in an amount of 1 part by weight to 10 parts by weight, and the metal fiber is contained in an amount of 1 part by weight to 20 parts by weight,
   wherein the thermoplastic resin comprises at least one of a nylon resin, a polycarbonate resin, a polyalkylene terephthalate resin, and a maleic anhydride-modified polyolefin resin,
   wherein the thermoplastic resin composition has an electromagnetic wave shielding ability (dB) of 70 dB or more as measured under a condition of 10 MHz using EM2107A manufactured by Electro-Metrics Corporation, or has an electromagnetic wave shielding ability (dB) of 70 dB or more as measured under a condition of 1 GHz using EM2107A manufactured by Electro-Metrics Corporation, and
   wherein the thermoplastic resin composition has a tensile strength of 150 MPa or more as measured according to ASTM D638.

2. The thermoplastic resin composition according to claim 1, wherein the maleic anhydride-modified polyolefin resin is a polymer prepared by grafting maleic anhydride onto a polyolefin resin at a grafting degree of 0.5% by weight to 2% by weight.

3. The thermoplastic resin composition according to claim 1, wherein the carbon fiber has an average diameter of 5 μm to 15 μm.

4. The thermoplastic resin composition according to claim 1, wherein the carbon nanotube has a BET surface area of 200 m$^2$/g to 300 m$^2$/g.

5. The thermoplastic resin composition according to claim 1, wherein the metal fiber has an average diameter of 5 μm to 20 μm.

6. The thermoplastic resin composition according to claim 1, wherein the thermoplastic resin composition is a thermoplastic resin composition for automobile components or electrical and electronic components having an electromagnetic wave shielding ability of 70 dB or more in MHz and GHz frequency range.

7. A method of molding the thermoplastic resin composition of claim 1, comprising:
   forming a first kneaded product by kneading a thermoplastic resin, carbon nanotube, and plate-shaped graphite;
   forming a second kneaded product by adding carbon fiber to the first kneaded product and kneading;
   forming a thermoplastic resin composition by adding metal fiber to the second kneaded product and kneading; and
   manufacturing a molded article by molding the thermoplastic resin composition.

* * * * *